(12) United States Patent
Wald et al.

(10) Patent No.: US 10,334,723 B2
(45) Date of Patent: Jun. 25, 2019

(54) FLEXIBLE DISPLAYS HAVING STIFF LAYERS FOR NEUTRAL PLANE ADJUSTMENT

(71) Applicant: 3M INNOVATIVE PROPERTIES COMPANY, St. Paul, MN (US)

(72) Inventors: Michael J. Wald, Woodbury, MN (US); Fay T. Salmon, Eden Prairie, MN (US); Dylan T. Cosgrove, Oakdale, MN (US); Albert I. Everaerts, Tucson, AZ (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 0 days.

(21) Appl. No.: 15/577,066

(22) PCT Filed: May 26, 2016

(86) PCT No.: PCT/US2016/034292
§ 371 (c)(1),
(2) Date: Nov. 27, 2017

(87) PCT Pub. No.: WO2016/196180
PCT Pub. Date: Dec. 8, 2016

(65) Prior Publication Data
US 2018/0177046 A1 Jun. 21, 2018

Related U.S. Application Data

(60) Provisional application No. 62/296,974, filed on Feb. 18, 2016, provisional application No. 62/170,494, filed on Jun. 3, 2015.

(51) Int. Cl.
*H05K 5/00* (2006.01)
*H01L 27/32* (2006.01)
(Continued)

(52) U.S. Cl.
CPC ............ *H05K 1/0281* (2013.01); *F21K 9/69* (2016.08); *H01L 27/3241* (2013.01);
(Continued)

(58) Field of Classification Search
CPC ............... H01L 51/524; H01L 51/5246; H01L 51/0097; H01L 27/3241; H05K 5/0017; H05K 1/0281
See application file for complete search history.

(56) References Cited

U.S. PATENT DOCUMENTS 5,077,870 A   1/1992   Melbye
5,845,375 A   12/1998  Miller
(Continued)

FOREIGN PATENT DOCUMENTS

EP   1584971   10/2005

OTHER PUBLICATIONS

International Search Report for PCT International Application No. PCT/US2016/034292, dated Sep. 1, 2016, 4 pages.

*Primary Examiner* — Karabi Guharay
(74) *Attorney, Agent, or Firm* — X. Christina Huang (57) ABSTRACT

At least some aspects of the present disclosure feature a flexible display including a plurality of functional layers, a plurality of bonding layers, and a stiff layer. Each of the plurality of bonding layers is disposed between two adjacent functional layers. The stiff layer having an elastic modulus greater than elastic modulus of the plurality of functional layers to adjust a position of a neutral plane of the flexible display within the display layer.

11 Claims, 9 Drawing Sheets

(51) Int. Cl.
*H05K 1/02* (2006.01)
*H01L 51/00* (2006.01)
*H01L 51/52* (2006.01)
*F21K 9/69* (2016.01)
*H05K 5/02* (2006.01)
*G09F 9/30* (2006.01)

(52) U.S. Cl.
CPC ........ *H01L 51/0097* (2013.01); *H01L 51/524* (2013.01); *H01L 51/5246* (2013.01); *H05K 5/0017* (2013.01); *H05K 5/0221* (2013.01); *G09F 9/301* (2013.01); *H01L 2251/5338* (2013.01); *Y02E 10/549* (2013.01)

(56) References Cited

U.S. PATENT DOCUMENTS

| | | | |
|---|---|---|---|
| 5,868,987 A | 2/1999 | Kampfer | |
| 6,357,128 B1 | 3/2002 | Iden | |
| 6,367,128 B1 | 4/2002 | Galkiewicz | |
| 6,546,604 B2 | 4/2003 | Galkiewicz | |
| 6,588,074 B2 | 7/2003 | Galkiewicz | |
| 8,264,143 B2 * | 9/2012 | Bae | H01L 51/5246 313/504 |
| 9,935,289 B2 * | 4/2018 | Chen | H01L 51/5253 |
| 2004/0183958 A1 | 9/2004 | Akiyama et al. | |
| 2007/0172971 A1 * | 7/2007 | Boroson | H01L 51/5246 438/26 |
| 2010/0258346 A1 | 10/2010 | Chen | |
| 2014/0345792 A1 | 11/2014 | Lee | |
| 2014/0367644 A1 | 12/2014 | Song | |
| 2015/0036269 A1 | 2/2015 | Kim | |
| 2015/0147532 A1 | 5/2015 | Nam | |
| 2015/0179722 A1 | 6/2015 | Koo | |

* cited by examiner

FLEXIBLE DISPLAYS HAVING STIFF LAYERS FOR NEUTRAL PLANE ADJUSTMENT

CROSS REFERENCE TO RELATED APPLICATIONS

This application is a national stage filing under 35 U.S.C. 371 of PCT/US2016/034292, filed May 26, 2016 which claims the benefit of Provisional Application No. 62/170494, filed Jun. 3, 2015, and Provisional Application No. 62/296974, filed Feb. 18, 2016, the disclosure of which is incorporated by reference in their entirety herein.

TECHNICAL FIELD

At least some aspects of the present disclosure relate to displays with interlocking devices. At least some aspects of the present disclosure relate to displays having stiff layers for neutral plane adjustment.

SUMMARY

At least some aspects of the present disclosure feature a flexible display, comprising: a plurality of functional layers comprising a display layer having a display component, a plurality of bonding layers comprising a bonding component, and a stiff layer. Each of the plurality of bonding layers is disposed between two adjacent functional layers. The stiff layer having an elastic modulus greater than an elastic modulus of each of the plurality of functional layers to adjust a position of a neutral plane of the flexible display within the display layer.

BRIEF DESCRIPTION OF DRAWINGS

The accompanying drawings are incorporated in and constitute a part of this specification and, together with the description, explain the advantages and principles of the invention. In the drawings.

In the drawings, like reference numerals indicate like elements. While the above-identified drawings, which may not be drawn to scale, set forth various embodiments of the present disclosure, other embodiments are also contemplated, as noted in the Detailed Description. In all cases, this disclosure describes the presently disclosed disclosure by way of representation of exemplary embodiments and not by express limitations. It should be understood that numerous other modifications and embodiments can be devised by those skilled in the art, which fall within the scope and spirit of this disclosure.

DETAILED DESCRIPTION

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

As used in this specification and the appended claims, the singular forms "a," "an," and "the" encompass embodiments having plural referents, unless the content clearly dictates otherwise. As used in this specification and the appended claims, the term "or" is generally employed in its sense including "and/or" unless the content clearly dictates otherwise.

Spatially related terms, including but not limited to, "lower," "upper," "beneath," "below," "above," and "on top," if used herein, are utilized for ease of description to describe spatial relationships of an element(s) to another. Such spatially related terms encompass different orientations of the device in use or operation in addition to the particular orientations depicted in the figures and described herein. For example, if an object depicted in the figures is turned over or flipped over, portions previously described as below or beneath other elements would then be above those other elements.

As used herein, when an element, component or layer for example is described as forming a "coincident interface" with, or being "on" "connected to," "coupled to" or "in contact with" another element, component or layer, it can be directly on, directly connected to, directly coupled with, in direct contact with, or intervening elements, components or layers may be on, connected, coupled or in contact with the particular element, component or layer, for example. When an element, component or layer for example is referred to as being "directly on," "directly connected to," "directly coupled to," or "directly in contact with" another element, there are no intervening elements, components or layers for example. As used herein, "powered" means a device receiving operational power.

Some aspects of the present disclosure are directed to a display, in some cases, a flexible display, using an interlocking device to provide adequate bonding strength and shear mobility. The interlocking device can be disposed between adjacent functional layers of a flexible display, for example, a support layer, a display layer, a protection layer, a touch device, or the like. Each functional layer can include one or more components. For example, the display layer can include an organic light-emitting device or other display device. As another example, the protection layer can include a touch sensitive device, a protection film, a light enhancement film, or the like. As yet another example, the support layer can include a supporting substrate, batteries, electrical circuit layer, or the like. In some embodiments, the interlocking device can be used with optical clear gel, adhesive, or liquid to improve bonding property and/or optical property.

Some aspects of the present disclosure are directed to a display, in some cases, a flexible display, having a stiff layer to configure the position of the neutral plane of the display. A neutral plane refers to a conceptual plane within a structure subjected to bending, where it is not under stress, neither compression nor tension. A stiff layer refers to a layer having a relative high elastic modulus, for example, greater than at least one layer or greater than other layers in a display. It is often desirable to position the neutral plane at, within, or proximate to the display layer where the display components are disposed.

Figure 1:
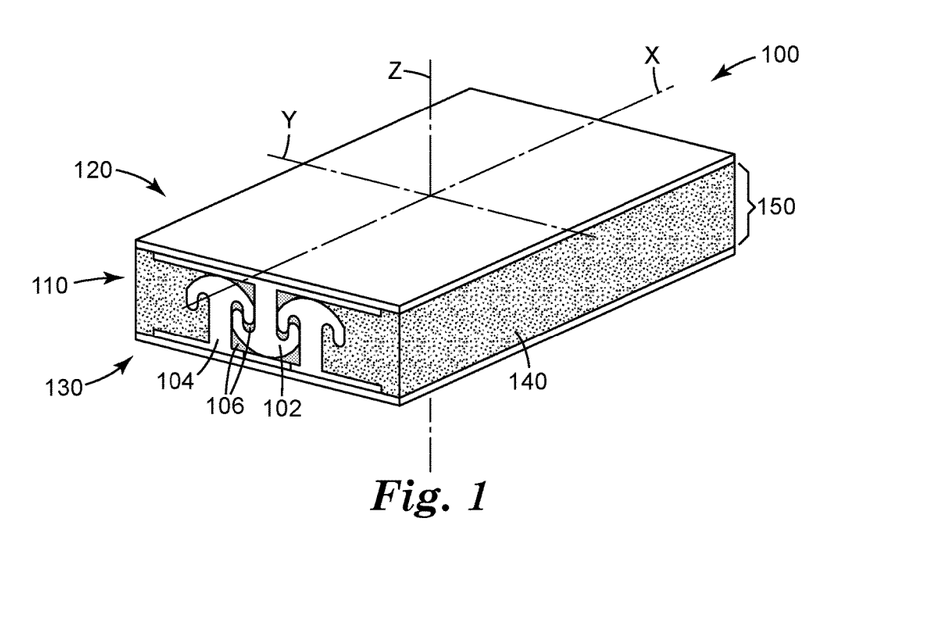
FIG. 1 illustrates a close-up conceptual view of a portion of a display using an interlocking device.

FIG. 1 illustrates a close-up conceptual view of a portion of a display 100 using an interlocking device 110. The display 100, as illustrated, includes a first layer 120 and a second layer 130 and a bonding layer 150 disposed between the two layers (120, 130). The bonding layer 150 includes the interlocking device 110. The display may include other layers besides layers 120 and 130. The interlocking device 110 includes a first interlocking component 102 attached to or integrated with the layer 120 and a second interlocking component 104 attached to or integrated with the layer 130. The second interlocking component 104 is configured to engage with the first interlocking component 102. In some embodiments, the engagement prevents the separation of the first layer 120 from the second layer 130 along the direction Z perpendicular to the surface of the second layer. In some embodiments, the engagement between the first and second interlocking components provides little or no restriction of the first layer 120 sliding with respect to the second layer in the direction X along the surface of the second layer 130. In some cases, the first interlocking component 120 and/or the second interlocking component 130 have channels that can facilitate or guide sliding between the two components. For example, the first interlocking component 120 and/or the second interlocking component 130 have rails or generally aligned elements forming channels.

In some embodiments, the interlocking device 110 can use materials that are optically clear, for example, material with visible light transmission at least 90% and haze less than 2%. In some cases, the interlocking device 110 can be disposed outside viewing area. In such cases, the interlocking device 110 can use materials that are not optically clear. In some implementations, the interlocking device 110 can include air gap between interlocking components. In some other cases, at least part of the interlocking device 110 can be disposed within viewing area. In such cases, the part of the interlocking device 110 disposed in the viewing area using an optically clear material, for example, optically clear polymer, or the like. In some embodiments, the optically clear polymer may be a selected polymer with a refractive index between 1.50 and 1.60, for example, polyester, polymethylmethacrylate, polycarbonate, cyclic olefin copolymer, or the like.

In some implementations, the bonding layer 150 can include bonding materials 140 can be disposed proximate to the first layer 120 and the second layer 130 together with the interlocking device 110. In some cases, the bonding material 140 can include an optically clear material, for example, optically clear adhesive, optically clear gel, optically clear liquid, or the like. With the interlocking device, the bonding material 140 can use materials that have relative low viscosity, for example, a low viscosity liquid, to reduce resistance to bending. In some embodiments, the bonding material 140 can use a material that has a refractive index closely matching the refractive index of the interlocking device 110. For example, the bonding material 140 can have an overall refractive index that has an absolute difference less than or equal to 0.05 from the refractive index of the part of interlocking device 110, more particularly the interlocking components 102 and 104, within the viewing area. For example, the bonding material 140 can include materials, for example, acrylates, urethanes, silicones, polyolefins, or the like.

In some embodiments, the interlocking device 110 has a height no more than 10 mm. In some cases, the interlocking device 110 has a height no more than 1 mm. In some cases, the interlocking device 110 has a height no more than 200 micrometers. In some cases, the interlocking device 110 has a height no more than 100 micrometers. In some cases, the interlocking device 110 has a height no less than 5 micrometers. In some embodiments, the interlocking device 110 further comprises an optical coupler 106 disposed proximate to the first interlocking component 102 and the second interlocking component 104. In some cases, the optical coupler 106 includes materials that have relatively low elastic modulus, low creep, and a high degree of shear strain under shear load to facilitate the repeated bending, for example, liquid, adhesive, gel, or the like. As an example, the optical coupler 106 can include a low viscosity liquid to reduce frictional drag between interlocking components and reduce resistance to bending.

In some embodiments, the optical coupler 106 can use a material that has a refractive index closely matching the refractive index of the interlocking device 110, more particular the interlocking components 102 and 104. In such cases, the optical clarity of the interlocking device 110 can be restored by eliminating the air gaps between the interlocking components 102 and 104. In some cases, the optical coupler 106 can have an overall refractive index that has an absolute difference less than or equal to 0.05 from the refractive index of the part of interlocking device 110, more particularly the interlocking components 102 and 104, within the viewing area. For example, the optical coupler 106 can include materials such as, for example liquids containing phenyl and phosphorus groups such as Santicizer 141 (available from Ferro, USA), or gels formulated using such liquids in combination with acrylate polymers using monomers containing higher refractive index contributing functional groups such as aromatic groups like phenyl, naphtyl, anthracyl, sulfur groups, bromine groups, or the like, to control and adjust the optical index of the gel. If a closely matching adhesive is used as optical coupling element 106 it cannot restrict the relative movement (i.e. relative sliding) of the interlocking device 110. In some cases, the optical coupler 106 can use the same material as the bonding material 140.

In some embodiments, the first interlocking component 102 or the second interlocking component 104 comprises a plurality of engagement elements. At least some of the engagement elements have a cross-sectional shape having a stem and a cap wider than the stem, as illustrated in FIG. 1, such that the engagement between the engagement elements prevents separation or displacement along the Z axis. In some cases, the first or the second interlocking component includes a plurality of engagement rails allowing sliding along the X axis. In some implementations, at least some of the engagement rails has a cross-sectional shape having a post and a cap. In some embodiments, each of the plurality of engagement elements or engagement rails has a height no more than 10 mm. In some cases, each of the plurality of engagement elements or engagement rails has a height no more than 1 mm. In some cases, each of the plurality of engagement elements or engagement rails has a height no more than 200 micrometers. In some cases, each of the plurality of engagement elements or engagement rails has a height no more than 100 micrometers. In some cases, each of the plurality of engagement elements or engagement rails has a height no less than 5 micrometers.

In some cases, the first interlocking component 102 includes a set of first engagement elements and the second interlocking component 104 includes a set of second engagement elements. In some cases, the first engagement elements have generally same shapes as the second engagement elements.

In some cases, the flexible display 100 has an X axis and a Y axis generally perpendicular to the X axis, where the flexible display 100 is configured to bend about the Y axis. In some embodiments, the interlocking device 110 is disposed along the X axis. In some cases, the interlocking device 110 is disposed proximate to two opposing edges of the flexible display 100 along the X axis. In some configurations, the flexible display 100 may include more than two functional layers, where every two adjacent functional layers have a bonding layer in between and the bonding layer includes an interlocking device.

Figure 2A:
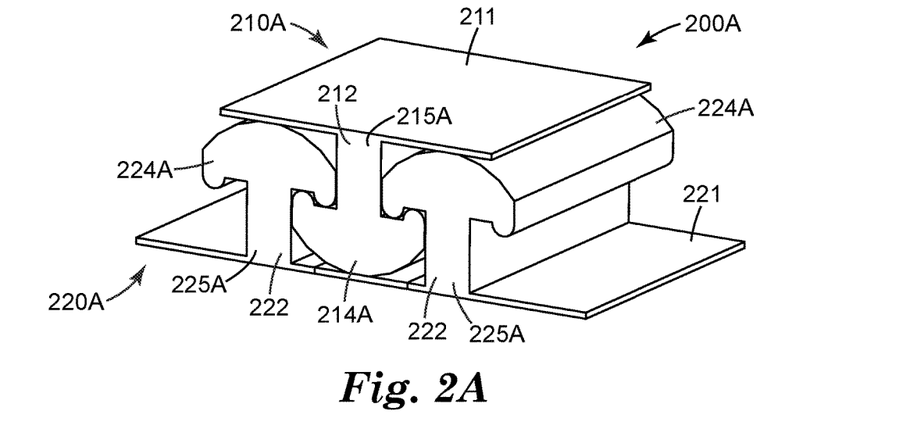
FIGS. 2A-2H illustrate some examples of interlocking devices.

FIGS. 2A-2F illustrate some examples of interlocking devices. Referring to FIG. 2A, an interlocking device 200A includes a first interlocking component 210A and a second interlocking component 220A configured to engage with the first interlocking component 210A. The first interlocking component 210A can include a substrate 211 and one or more engagement rails 215A. The second interlocking component 220A can include a substrate 221 and one or more engagement rails 225A. The engagement rail 215A includes a stem 212 and a cap 214A that is wider than the stem 212. The cross section of the engagement rail 215A is in a mushroom-like shape. Similarly, the engagement rail 225A includes a stem 222 and a cap 224A that is wider than the stem 222. This design may have a little gap between the two interlocking components.

Figure 2B:
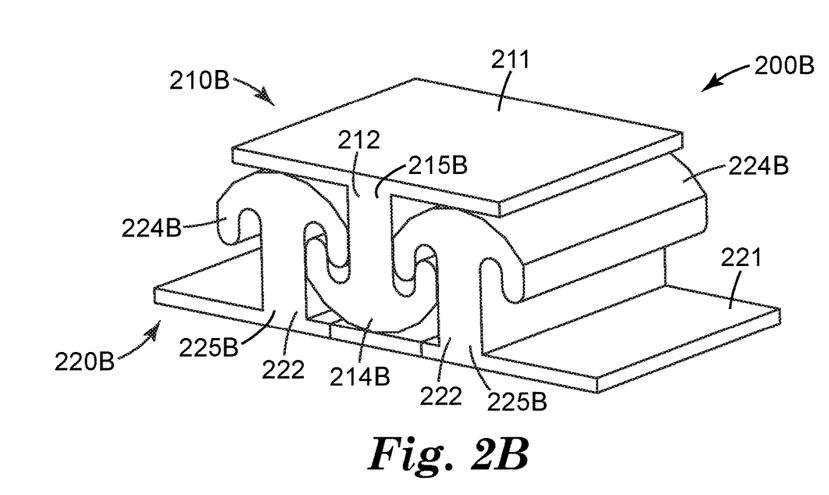

FIG. 2B illustrates a similar design of an interlocking device 200B as the interlocking device 200A. The first interlocking component 210B can include a substrate 211 and one or more engagement rails 215B. The second interlocking component 220B can include a substrate 221 and one or more engagement rails 225B. The engagement rail 215B includes a stem 212 and a cap 214B that is wider than the stem 212. The cross section of the engagement rail 215B is in a mushroom-like shape. Similarly, the engagement rail 225B includes a stem 222 and a cap 224B that is wider than the stem 222. With this configuration, the two interlocking components (210B, 220B) have more overlaps between the caps (214B, 224B) that may provide higher through thickness bonding strength than the configuration illustrated in FIG. 2A.

Figure 2C:
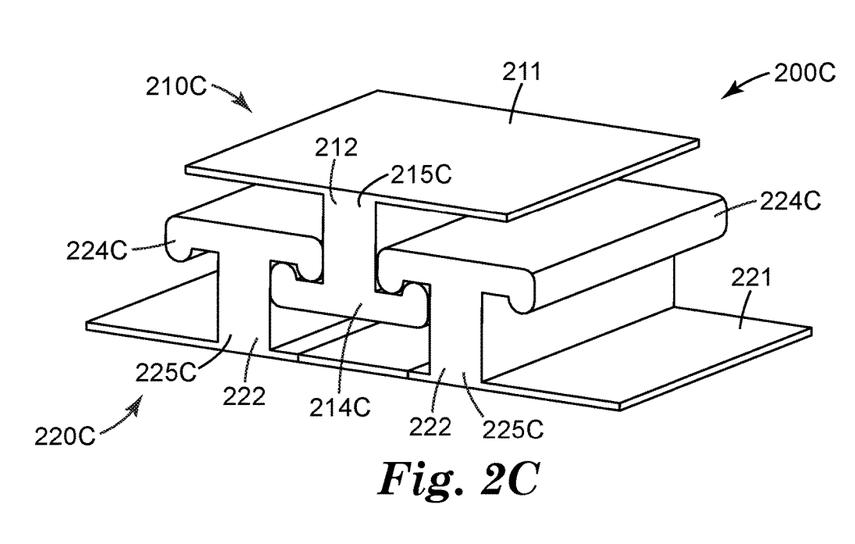

FIG. 2C illustrates an example of an interlocking device 200C. The interlocking device 200C includes a first interlocking component 210C and a second interlocking component 220C configured to engage with the first interlocking component 210C. The first interlocking component 210C can include a substrate 211 and one or more engagement rails 215C. The second interlocking component 220C can include a substrate 221 and one or more engagement rails 225C. The engagement rail 215C includes a stem 212 and a cap 214C that is wider than the stem 212. The cross section of the engagement rail 215C is in a mushroom-like shape. Similarly, the engagement rail 225C includes a stem 222 and a cap 224C that is wider than the stem 222. The caps 214C and 224C are generally flat. With this design, the two interlocking components (210C, 220C) having more gaps in between, which may reduce friction and improve bending flexibility. More configurations and relative spacing and materials of engagement rails are described in U.S. Pat. Nos. 6,357,128, 6,546,604, and 6,588,074, which are incorporated by reference in their entirety.

Figure 2D:
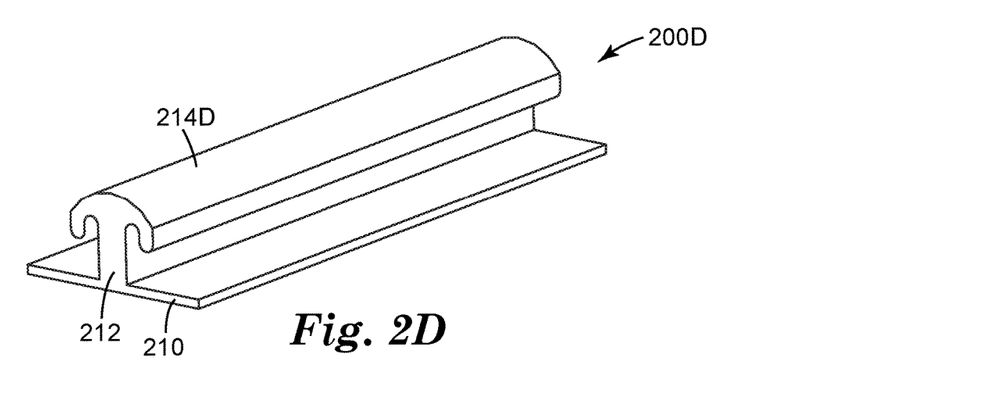
Figure 2E:
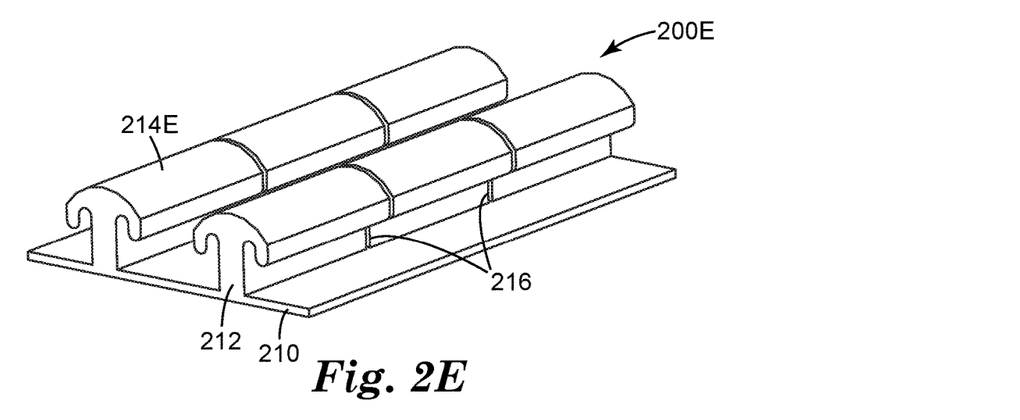

FIGS. 2D and 2E illustrate some examples of engagement rails (200D, 200E) with similar shapes. The engagement rail 200D, supported by a substrate 210, has a stem 212 and a cap 214D, similar to the ones illustrated in FIG. 2B. The engagement rail 200E has a similar shape as the engagement rail 200D but one or more slits 216 along a direction generally perpendicular to the longitudinal direction of the engagement rail 200E. In some cases, the slit 216 may have a small angle, for example, 5°, from the direction perpendicular to the general surface of the engagement rail 200E. In some embodiments, the distance between two adjacent slits 216 is within a range between ¼ of a height of the engagement rail 200E and 50 times of the height. In some cases, the slits 216 can be an opening through a portion of the engagement rail 200E, for example, the entirety of the cap 214E, stem 212, and/or substrate 210. As another example, the slits 216 can be an opening through a portion of the cap 214D, stem 212, and/or substrate 210. In some cases, the slits 216 can have a predefined width, which may allow bending along both directions (i.e., inward and outward) that are generally perpendicular to the surface of the substrate 210. The slits 216 can be disposed along the entire length of the engagement rail, or proximate to selected location(s). The slit 216 can improve bending flexibility of the engagement rails and the interlocking device formed thereof.

Figure 2F:
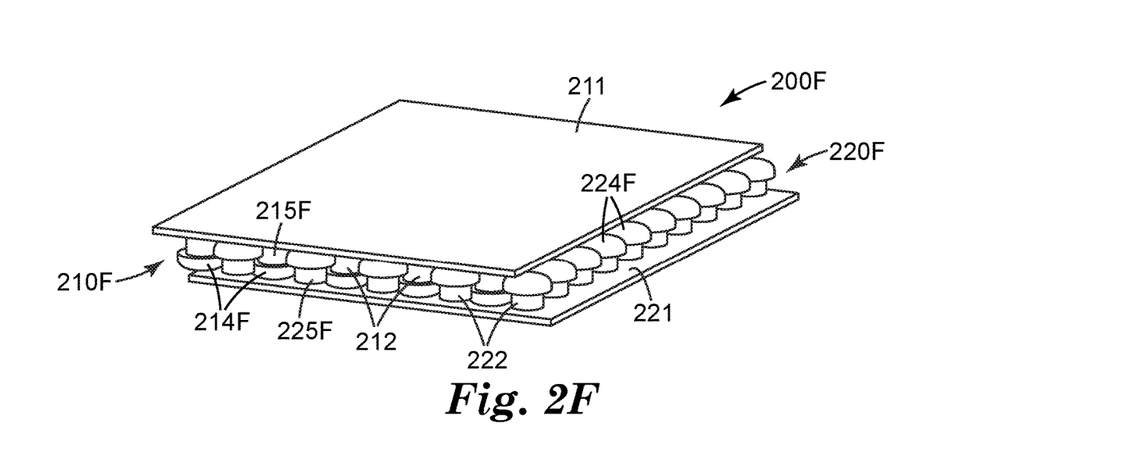

FIG. 2F illustrates another example of an interlocking device 200F. The interlocking device 200F includes a first interlocking component 210F and a second interlocking component 220F configured to engage with the first interlocking component 210F. The first interlocking component 210F can include a substrate 211 and one or more engagement elements 215F. The second interlocking component 220F can include a substrate 221 and one or more engagement elements 225F. The engagement element 215F includes a stem 212 and a cap 214F that is wider than the stem 212. The cross section of the engagement element 215F is in a mushroom-like shape. Similarly, the engagement element 225F includes a stem 222 and a cap 224F that is wider than the stem 222. In some embodiments as illustrated in FIG. 2F, the engagement elements 215F and 225F are disposed with regular spacing. In some cases, the engagement elements 215F and/or 225F form rows to allow or guide sliding. The spacing of the rows of stems and the size of the caps can be selected to provide a desired degree of mechanical engagement along the direction generally perpendicular to the substrate (211 or 221), while still allowing easy sliding along the direction of the rows. The caps, on the stems of the interlocking components, on one or both of the interlocking components, can have a shape other than generally round or mushroom shaped. For example the caps on one or more engagement elements can be oblong or oval shaped. Suitable materials for this include those taught in U.S. Pat. Nos. 5,077,870 and 5,845,375 for round or mushroom shaped caps, and as taught in U.S. Pat. No. 5,868,987 for oval or oblong shaped caps, which are incorporated by reference in their entireties.

Figure 2G:
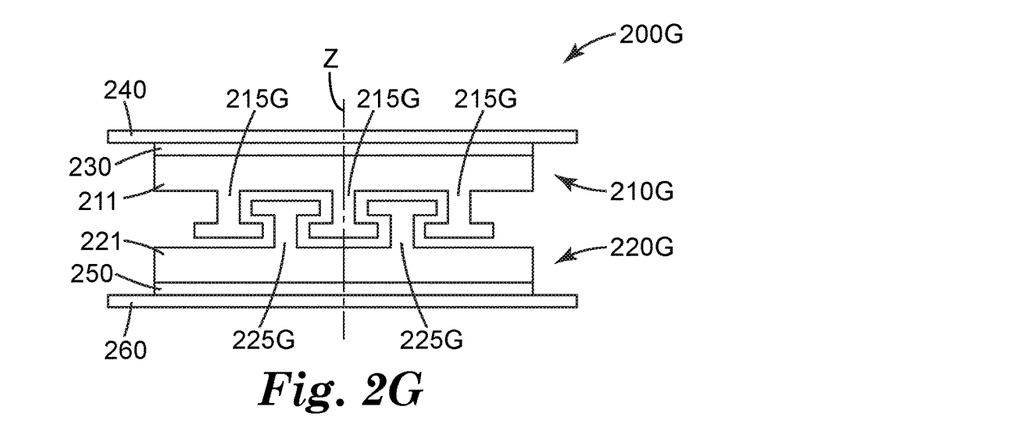
Figure 2H:
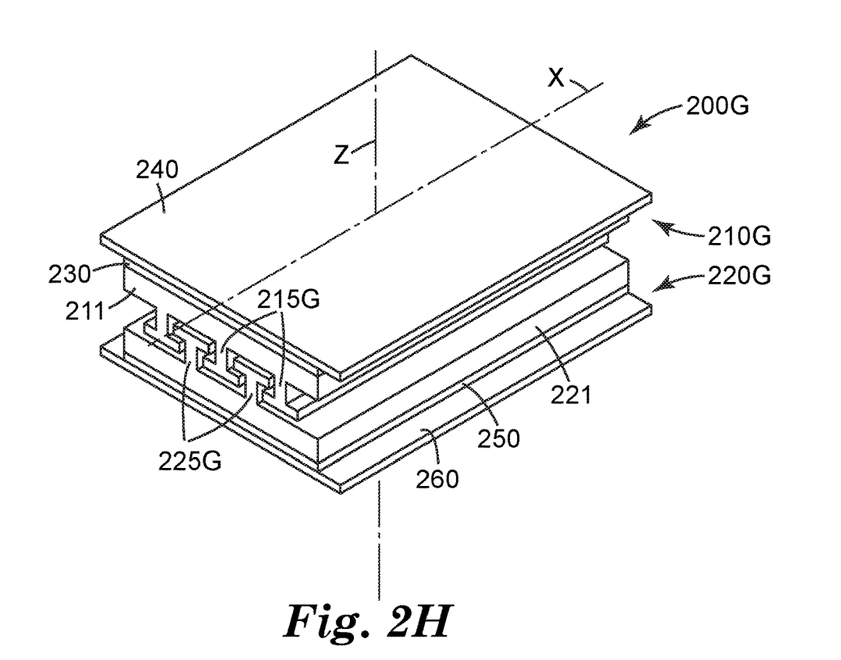

FIG. 2G illustrates a cross-section view of a conceptual example of interlocking device 200G that can be provided in a tape form or a sheet form; and FIG. 2H illustrates a prospective view of the interlocking device 200G. The interlocking device 200G includes a first interlocking component 210G, a second interlocking component 220G, a first adhesive layer 230, a first release liner 240, a second adhesive layer 250, and a second release liner 260. The first interlocking component 210G includes a substrate 211 and one or more engagement rails 215G and the second interlocking component 220G includes a substrate 221 and one or more engagement rails 225G. The engagement rails (215G, 225G) allow relative sliding along longitudinal direction of the rail between the interlocking components and prevent separation along Z direction that is generally perpendicular to the surface of the substrate 211 or 221. The interlocking components (210G, 220G) may use any configuration of interlocking components described herein, for example, including slits.

Figure 3A:
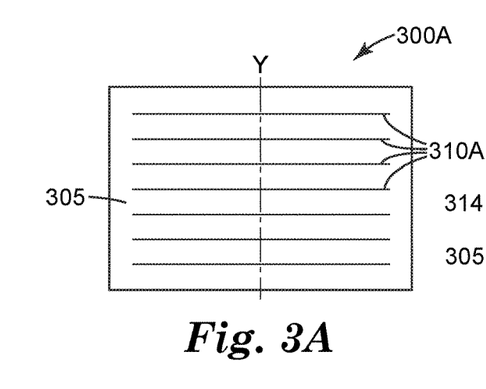
FIGS. 3A-3F illustrate some example of disposition of the interlocking segments.

In some embodiments, an interlocking device may include a plurality of interlocking segments. Each of the interlocking segments can include two interlocking components, where each interlocking component may use any configuration of interlocking components described herein. The plurality of interlocking segments may be disposed in a geometry pattern. FIGS. 3A-3F illustrate some example of disposition of the interlocking segments. FIG. 3A illustrates an interlocking device 300A disposed on a functional layer 305 of a display. The interlocking device 300A includes a plurality of interlocking segments 310A disposed generally perpendicular to the bending direction Y. In some embodiments, at least two of the plurality of interlocking segments 310A are generally parallel to each other. In one embodiment, every two adjacent interlocking segments 310A have a generally equal spacing along Y axis.

Figure 3B:
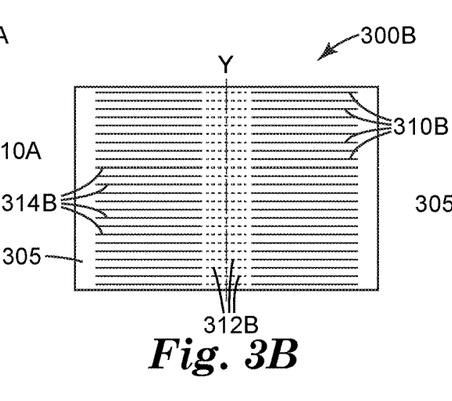
Figure 3C:
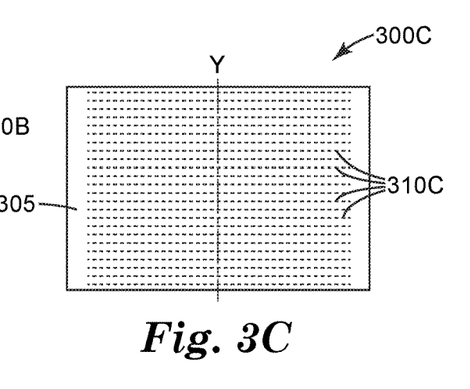

FIG. 3B illustrates another example of an interlocking device 300B disposed on a functional layer 305 of a display. The interlocking device 300B includes a first set of interlocking segments 310B generally parallel to each other, a second set of interlocking segments 314B generally parallel to each other, and a third set of interlocking segments 312B disposed between the first and second sets of interlocking segments. The third set of interlocking segments 312B can be disposed in a bending area providing adequate bending flexibility. FIG. 3C illustrates an example of an interlocking device 300C disposed on a functional layer 305 of a display. The interlocking device 300C includes a plurality of short interlocking segments or individual interlocking elements 310C dispersed on the surface of the functional layer 305, which may allow adequate bonding property and bending flexibility.

Figures 3D, 3E:
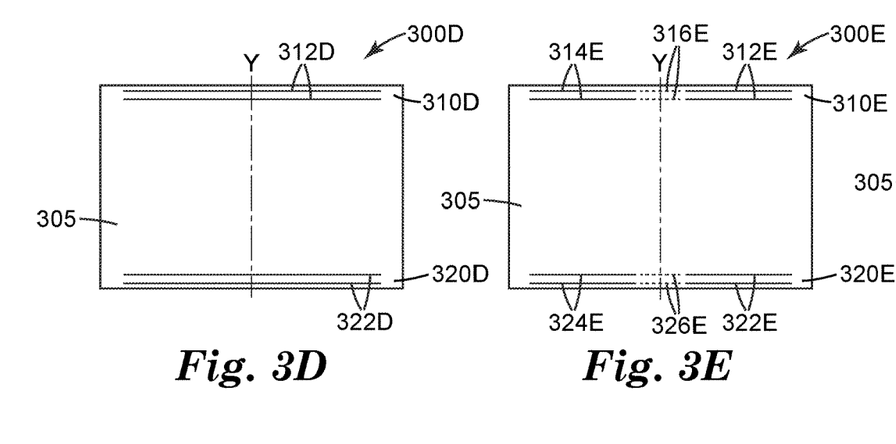

FIG. 3D illustrates an example of an interlocking device 300D disposed on a functional layer 305 of a display. The interlocking device 300D comprises a first set of interlocking segments 310D and a second set of interlocking segments 320D. The first set of interlocking segments 310D are disposed approximate to a first edge along X axis of the functional layer 305 and the second set of interlocking segments 320D are disposed approximate to a second edge along X axis of the functional layer 305. The first set of interlocking segments 310D includes two generally parallel interlocking segments 312D. The second set of interlocking segments 320D includes two generally parallel interlocking segments 322D.

FIG. 3E illustrates another example of an interlocking device 300E disposed on a functional layer 305 of a display. The interlocking device comprises a first set of interlocking segments 310E and a second set of interlocking segments 320E. The first set of interlocking segments 310E are disposed approximate to a first edge along X axis of the functional layer 305 and the second set of interlocking segments 320E are disposed approximate to a second edge along X axis of the functional layer 305. The first set of interlocking segments 310E includes two generally parallel interlocking segments 312E disposed on a first side, two generally parallel interlocking segments 314E disposed on a second side, and a set of short interlocking segments 316E disposed between the first side and the second side. The second set of interlocking segments 320E includes two generally parallel interlocking segments 322E disposed on a first side, two generally parallel interlocking segments 324E disposed on a second side, and a set of short interlocking segments or individual interlocking elements 326E disposed between the first side and the second side.

Figure 3F:
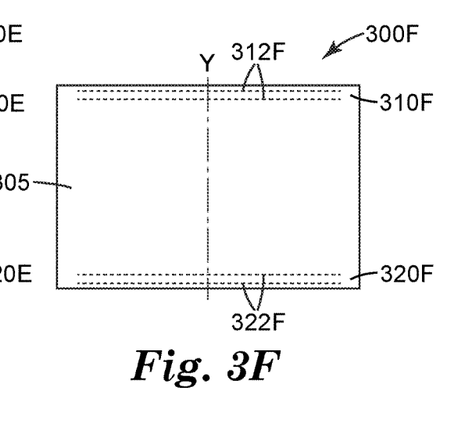

FIG. 3F illustrates yet another example of an interlocking device 300F disposed on a functional layer 305 of a display. The interlocking device comprises a first set of interlocking segments 310F and a second set of interlocking segments 320F. The first set of interlocking segments 310F are disposed approximate to a first edge along X axis of the functional layer 305 and the second set of interlocking segments 320F are disposed approximate to a second edge along X axis of the functional layer 305. The first set of interlocking segments 310F includes a set of short interlocking segments or individual interlocking elements 312F. The second set of interlocking segments 320F includes a set of short interlocking segments or individual interlocking elements 322F.

Figure 4:
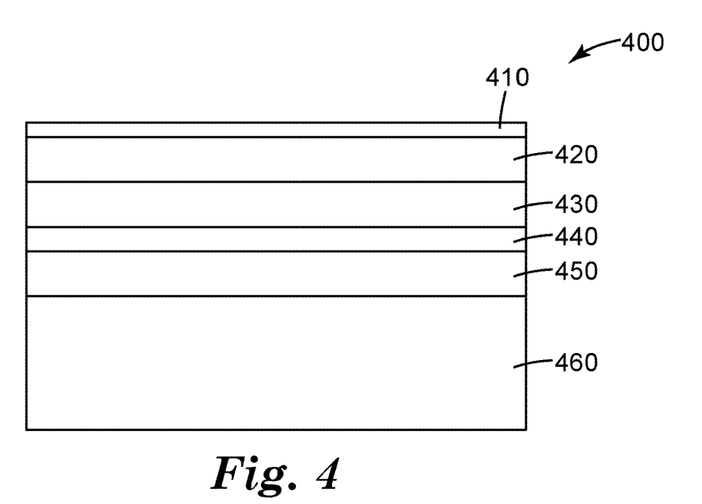
FIG. 4 illustrates a cross-sectional view of one example of a display having a stiff layer.

In some embodiments, it is desirable to adjust the position of the neutral plane of a flexible display to a location that requires low tension and/or compression, for example, the display layer including components sensitive to stress (e.g., indium tin oxide (ITO) driving electrode, thin film transistor, etc.). A flexible display may have a plurality of functional layers including the display layer and a plurality of bonding layers, where the neutral plane is located outside the display layer. At least some aspects of the present disclosure direct to adding a stiff layer to the display to adjust the neutral plane. FIG. 4 illustrates a cross-sectional view of one example of a display 400 having a stiff layer 410. The display has a first layer 420, a first bonding layer 430, a display layer 440, a second bonding layer 450, and a second layer 460. As an example, the first layer 420 has an elastic modulus of 1 GPa and a thickness of 25 µm; the first bonding layer 430 has an elastic modulus of 100 KPa and a thickness of 25 µm; the display layer 440 has an elastic modulus of 10 GPa and a thickness of 15 µm; the second bonding layer 450 has an elastic modulus of 100 KPa and a thickness of 25 µm; and the second layer 460 has an elastic modulus of 10 GPa and a thickness of 75 µm. The position of neutral plane can be calculated using Equation (1):

$$y_{NP} = \frac{\sum_{i=1}^{n} \bar{y}_i E_i A_i}{\sum_{i=1}^{n} E_i A_i} \quad (1)$$

where $y_{NP}$ is the position of the neutral plane measured from a reference plane, such as the bottom surface of the second layer, $\bar{y}_i$ is the distance from the reference plane to the centroid of the $i^{th}$ layer where i identifies the layer from 1 to n where n is defined as the number of layers in film stack or flexible display, $E_i$ is the elastic modulus of the $i^{th}$ layer, and $A_i$ is the cross sectional area of the $i^{th}$ layer.

In some embodiments, the stiff layer is selected to use materials with elastic modulus greater than the lowest elastic modulus of the functional layer. Using the above example, the stiff layer has an elastic modulus greater than 1 GPa. The stiff layer 410 can be disposed above or below any layer. For example, the stiff layer 410 can be disposed above or below the first layer, or above or below the second layer. The stiff layer can use materials such as, for example, flexible glass, metal foil, fiber reinforced plastic, or the like. In some embodiments, a thickness of the stiff layer is selected at least in part based on at least one of the plurality of functional layers' elastic modulus. In some cases, a thickness of the stiff layer is selected at least in part based on at least one of the plurality of functional layers' thickness. In some cases, a thickness of the stiff layer selected at least in part based on at least one of the plurality of bonding layers' elastic modulus. In some cases, a thickness of the stiff layer is selected at least in part based on at least one of the plurality of bonding layers' thickness.

Figure 5A:
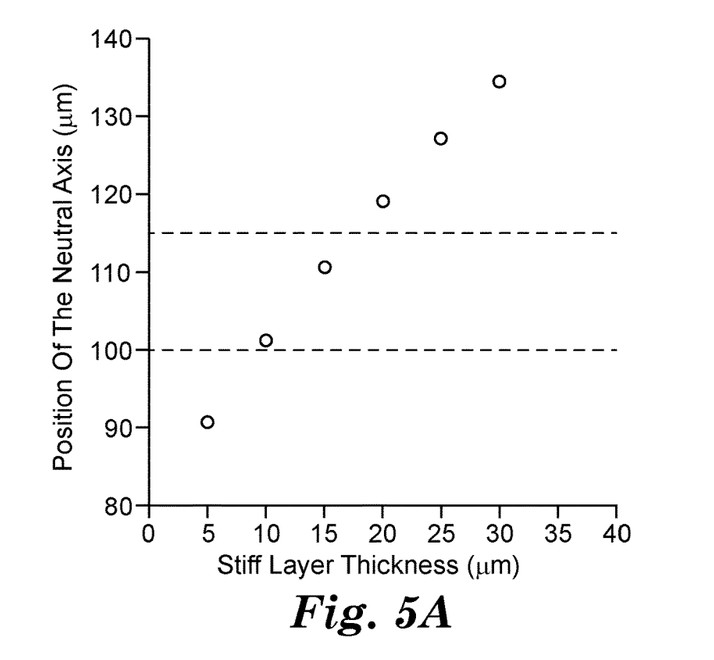
FIGS. 5A-5D illustrate the position of a neutral plane versus the thickness of the stiff layer, where the stiff layer has various elastic modulus.
Figure 5B:
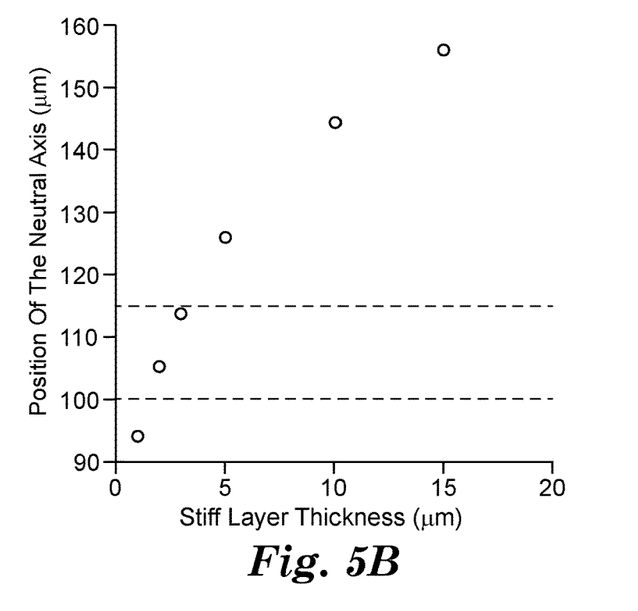

FIG. 5A illustrates the position of a neutral plane versus the thickness of the stiff layer for the stiff layer having an elastic modulus of 10 GPa, where the stiff layer 410 is placed on the top surface of the first layer 420. The dotted lines indicate the position of the upper and lower surfaces of the display layer 440. As illustrated, the stiff layer 410 having a thickness between 10-15 μm will adjust the neutral plane position proximate to the display layer. FIG. 5B illustrates the position of a neutral plane versus the thickness of the stiff layer for the stiff layer having an elastic modulus of 70 GPa, where the stiff layer 410 is placed on the top surface of the first layer 420. The dotted lines indicate the position of the upper and lower surfaces of the display layer 440. As illustrated, the stiff layer 410 having a thickness less than 5 μm will adjust the neutral plane position at the display layer. In some implementations, having a material with greater elastic modulus, the stiff layer can reduce its thickness, which may be desirable for some flexible display configurations.

Figure 5C:
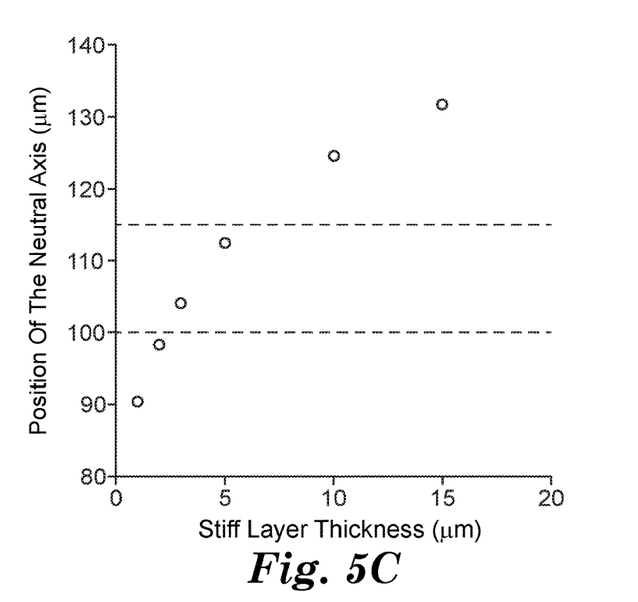
Figure 5D:
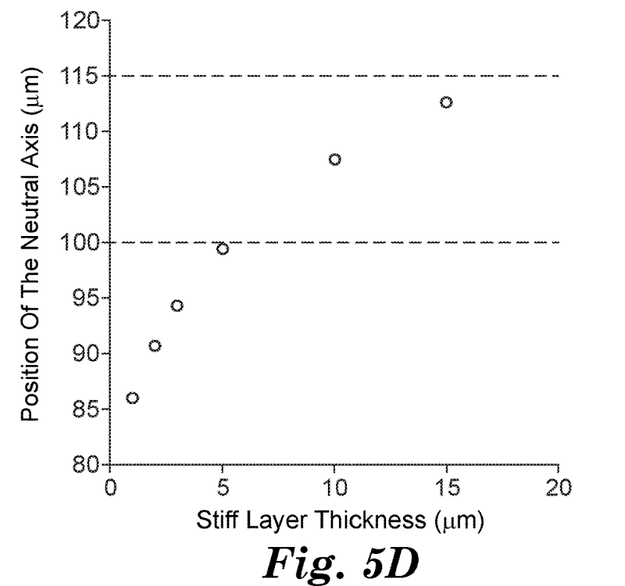

FIG. 5C illustrates the position of a neutral plane versus the thickness of the stiff layer for the stiff layer having an elastic modulus of 70 GPa, where the stiff layer 410 is placed on the bottom surface of the first layer 420. The dotted lines indicate the position of the upper and lower surfaces of the display layer 440. FIG. 5D illustrates the position of a neutral plane versus the thickness of the stiff layer for the stiff layer having an elastic modulus of 70 GPa, where the stiff layer 410 is placed on the top surface of the display layer 440. The dotted lines indicate the position of the upper and lower surfaces of the display layer 440.

In some embodiments, one of the plurality of bonding layers of the flexible display 400 may have an interlocking device. The interlocking device can use any one of the configurations described herein. Such embodiments may reduce stress in the display layer and improve bending flexibility of the display. In some embodiments, the stiff layer 410 includes an interlocking device, using any one of the configurations described herein. The stiff layer 410 may also include materials, for example, flexible glass, metal foil, fiber reinforced plastic, or the like.

Figure 6A:
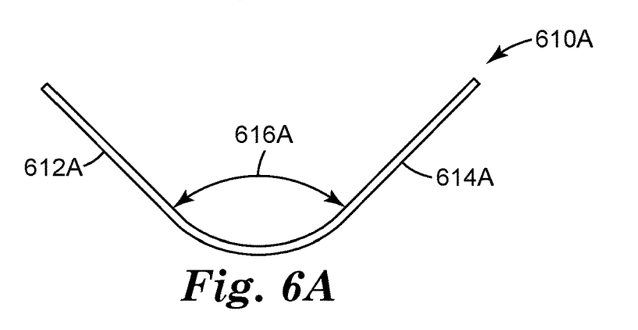
FIGS. 6A-6D illustrate some examples of functional layer(s) having a nonplanar shape in an unstrained state.
Figure 6B:
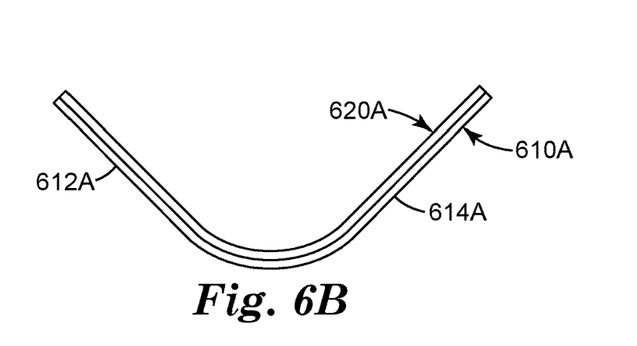

In some embodiments, a display may include a functional layer that is nonplanar in an unstrained state. For example, the display layer may be in a bent shape at an unstrained state. In one embodiment, a flexible or foldable display includes a plurality of functional layers comprising a display layer having a display component and a plurality of bonding layers, as illustrated in FIG. 4 with or without a stiff layer. Each of the plurality of bonding layers is disposed between two adjacent functional layers. As illustrated in FIG. 6A, one of the plurality of functional layers 610A is nonplanar in an unstrained state. In one embodiment, the functional layer 610A has a first part 612A and a second part 614A forming an angle 616A with the first part 612A when the functional layer 610A is in the unstrained state. In some cases, the angle 616A is less than 150°. In some cases, the angle 616A is greater than 45°. In some cases, the angle 616A is approximately 90°. In some cases, the angle 616A is in the range of 80°-100°. In some implementations, a bonding layer 620A is disposed on the functional layer 610A in the unstrained state. As an example, the bonding layer 620A includes optically clear adhesive. The bonding layer may use any embodiment of bonding layer described herein.

In some implementations, a flexible or foldable display includes one or more functional layers having a nonplanar substrate in an unstrained state. In some cases, none of the nonplanar functional layers is a protective layer. A finite element analysis is performed on four samples, where a two (2) mm sample of polyethylene terephthalate (PET) is originally formed flat, or formed with a radius of 1R, 2R, or 4R in unstrained state. The samples are then bent to a radius of R and also forced to lay flat. The analysis utilized linear elastic material behaviors to describe all functional layers of the display to create the prescribed motions. The analysis was considered static in nature and ignored thermal effects. The maximum stress and the minimum and maximum strain are then recorded for those four scenarios. The results are summarized in Table 1. The results show that the maximum stress experienced at the extreme conditions (held flat and bent to radius R) can be greatly reduced by using layers that have a nonplanar unstrained state.

TABLE 1

| Unstrained State | When bent to radius = R | | | When held Flat | | |
| --- | --- | --- | --- | --- | --- | --- |
| | Max Stress (Mpa) | Min Strain (m/m) | Max Strain (m/m) | Max Stress (Mpa) | Min Strain (m/m) | Max Strain (m/m) |
| infinite (flat) | 14.4 | −0.197 | 0.205 | 0 | 0 | 0 |
| 1R | 10.617 | −0.15 | 0.153 | 17.22 | −0.177 | 0.238 |
| 2R | 7.165 | −0.103 | 0.09 | 8.859 | −0.107 | 0.127 |
| 4R | 10.339 | −0.107 | 0.127 | 4.587 | −0.06 | 0.066 |

Figure 6C:
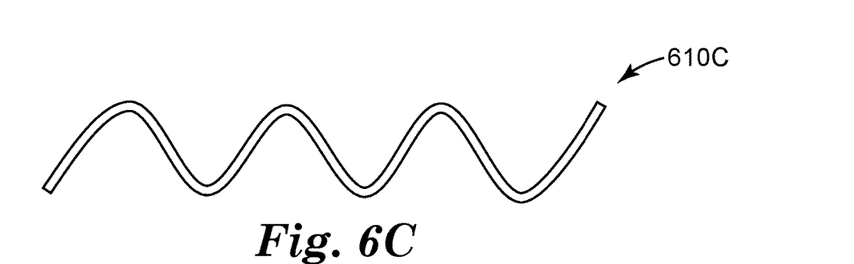
Figure 6D:
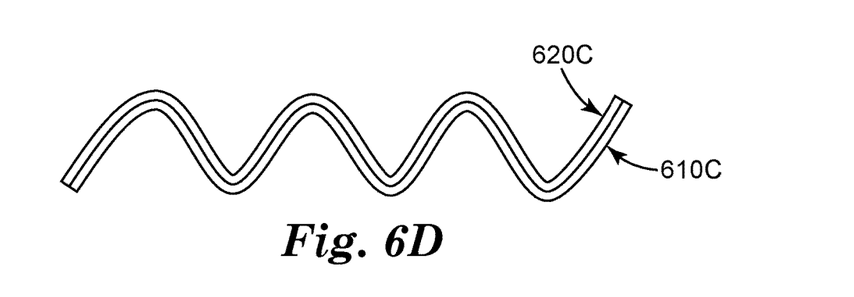

FIG. 6C illustrates another example of a functional layer 610C having a nonplanar shape in an unstrained state. As illustrated, the functional layer 610C has a wavy shape when the functional layer 610C is in the unstrained state. As illustrated in FIG. 6D, a bonding layer 620C can be disposed on the functional layer in the unstrained state.

EXAMPLES

Example 1

Flexible Display with Interlocking Sheets Assembly

A film stack was assembled using two 2.60E1 cm (1.02E1 inches)×1.88E1 cm (7.40 inches)×2.54E-2 cm (1.0E-2 inches) Lexan™ 9034 polycarbonate sheets obtained from United States Plastic Corp. of Lima, Ohio as the first layer 120 and second layer 130 represented in FIG. 1. Both sides of two interlocking 2.60E1 cm (1.02E1 inches)×1.0E0 cm (3.93E-1 inches)×2.00E-1 (7.87E-2 inches) devices 110 obtained from 3M Company of St. Paul, Minn. and described in U.S. Pat. No. 6,367,128, entitled "Self-mating Reclosable Mechanical Fastener," which is incorporated herein by reference in entirety, were secured to the polycarbonate sheets by applying a layer of 2.54E-2 cm (1.00E-2 inch) thick CEF 2210 optically clear adhesive (OCA) obtained from 3M Company of St. Paul, Minn. The interlocking devices 110 were positioned lengthwise, perpendicular to the bending direction, on the polycarbonate sheets a distance of 4.00E-1 cm (1.57E-1 inches) from each edge as represented in FIG. 3F.

Example 2

Flexible Display with Adjustable Stiff Layers—Assembly

As represented in FIG. 4, a film stack was assembled using a 2.60E1 cm (1.02E1 inches)×1.88E1 cm (7.40 inches)×7.5E-3 cm (2.9E-3 inches) Lexan™ 9034 polycarbonate sheet obtained from United States Plastic Corp. of Lima, Ohio as the second layer 460. The second layer 460 had an elastic modulus of 2.5 GPa. A 2.60E1 cm (1.02E1 inches)×1.88E1 cm (7.40 inches)×2.5E-3 cm (9.8E-4 inch) layer 450 of CEF 2210 optically clear adhesive (OCA) obtained from 3M Company of St. Paul, Minn. was placed on top of the second layer. A 2.60E1 cm (1.02E1 inches)×1.88E1 cm (7.40 inches)×1.5E-3 cm (5.9.E-4 inches) ECO-VYLOPET® EMC2330 display layer 440 obtained from Toyobo America of Osaka, Japan was positioned on top of the layer of OCA 450. The elastic modulus of the display layer was 10 GPa. A 2.60E1 cm (1.02E1 inches)×1.88E1 cm (7.40 inches)×2.5E-3 cm (9.8E-4 inch) layer 430 of CEF 2210 optically clear adhesive (OCA) obtained from 3M Company of St. Paul, Minn. was placed on top of the display layer 440. The two layers of CEF 2210 OCA each had an elastic modulus of 1.00E-4 GPa. A first layer 420 of 2.60E1 cm (1.02E1 inches)×1.88E1 cm (7.40 inches)×2.5E-3 cm (9.8E-4 inches) Alathon H5112 HDPE display layer obtained from LyondellBasell of Rotterdam, South Holland was placed on top of the OCA layer 430. The elastic modulus of the first layer 420 was 1 GPa.

Example 3

Flexible Display with Adjustable Stiff Layers—Neutral Plane Shift

A stiff adjusting layer was added to the top surface of the film stack second layer described in Example 2. Movement of the neutral plane position relative to a reference plane was calculated based upon the thickness of the stiff layer applied. The relationship used to calculate the shifting of the neutral plane position was described as:

$$y_{NP} = \frac{\sum_{i=1}^{n} \bar{y}_i E_i A_i}{\sum_{i=1}^{n} E_i A_i}$$

where $y_{NP}$ was the position of the neutral plane measured from the reference plane such as the lower portion of the second layer, $\bar{y}_i$ was the distance from the reference plane to the centroid of the $i^{th}$ layer where i identifies the layer from 1 to n where n was defined as the number of layers in film stack, $E_i$ was the elastic modulus of the $i^{th}$ layer, and $A_i$ was the cross sectional area of the $i^{th}$ layer.

Table 2 provides a summary of the results and FIG. 5A provides a visual representation when the stiff layer added had an elastic modulus of 10 GPa. The reference plane was designated as the bottom surface of the second layer 460.

TABLE 2

| Stiff Layer Thickness (cm) | Position of Neutral Plane (cm) |
|---|---|
| 5.0E-4 | 9.08E-3 |
| 1.0E-3 | 1.01E-2 |
| 1.5E-3 | 1.11E-2 |
| 2.0E-3 | 1.19E-2 |
| 2.5E-3 | 1.27E-2 |
| 3.0E-3 | 1.34E-2 |

Table 3 provides a summary of the results and FIG. 5B provides a visual representation when the stiff layer added had an elastic modulus of 70 GPa.

TABLE 3

| Stiff Layer Thickness (cm) | Position of Neutral Plane (cm) |
|---|---|
| 1.0E-4 | 9.41E-3 |
| 2.0E-4 | 1.05E-2 |
| 3.0E-4 | 1.13E-2 |
| 5.0E-4 | 1.26E-2 |
| 1.0E-3 | 1.44E-2 |
| 1.5E-3 | 1.56E-2 |

Example 4

Flexible Display with Adjustable Stiff Layers—Neutral Plane Shift

A stiff adjusting layer was added to the bottom surface of the first layer 420 described in Example 2. Movement of the neutral plane position relative to a reference plane was calculated based upon the thickness of the stiff layer applied. The relationship used to calculate the shifting of the neutral plane position was described as:

$$y_{NP} = \frac{\sum_{i=1}^{n} \bar{y}_i E_i A_i}{\sum_{i=1}^{n} E_i A_i}$$

where $y_{NP}$ was the position of the neutral plane measured from the reference plane such as the lower portion of the second layer, $\bar{y}_i$ was the distance from the reference plane to the centroid of the $i^{th}$ layer where i identifies the layer from 1 to n where n was defined as the number of layers in film stack, $E_i$ was the elastic modulus of the $i^{th}$ layer, and $A_i$ was the cross sectional area of the $i^{th}$ layer.

Table 4 provides a summary of the results and FIG. 5C provides a visual representation when the stiff layer added had an elastic modulus of 70 GPa.

TABLE 4

| Stiff Layer Thickness (cm) | Position of Neutral Plane (cm) |
|---|---|
| 1.0E-4 | 9.04E-3 |
| 2.0E-4 | 9.82E-3 |

TABLE 4-continued

| Stiff Layer Thickness (cm) | Position of Neutral Plane (cm) |
|---|---|
| 3.0E−4 | 1.04E−2 |
| 5.0E−4 | 1.12E−2 |
| 1.0E−3 | 1.24E−2 |
| 1.5E−3 | 1.31E−2 |

A stiff neutral plane adjusting layer was added to the top surface of the display layer described in Example 2. Movement of the neutral plane position relative to a reference plane was calculated based upon thickness of the stiff layer applied. The relationship used to calculate the shifting of the neutral plane position was described as:

$$y_{NP} = \frac{\sum_{i=1}^{n} \bar{y}_i E_i A_i}{\sum_{i=1}^{n} E_i A_i}$$

where $y_{NP}$ was the position of the neutral plane measured from the reference plane such as the lower portion of the second layer 460, $\bar{y}_i$ was the distance from the reference plane to the centroid of the $i^{th}$ layer where i identifies the layer from 1 to n where n was defined as the number of layers in the film stack, $E_i$ was the Young's modulus of the $i^{th}$ layer, and $A_i$ was the cross sectional area of the $i^{th}$ layer.

Table 5 provides a summary of the results and FIG. 5D provides a visual representation when the stiff layer added had an elastic modulus of 70 GPa.

TABLE 5

| Stiff Layer Thickness (cm) | Position of Neutral Plane (cm) |
|---|---|
| 1.0E−4 | 8.60E−3 |
| 2.0E−4 | 9.07E−3 |
| 3.0E−4 | 9.42E−3 |
| 5.0E−4 | 9.94E−3 |
| 1.0E−3 | 1.07E−2 |
| 1.5E−3 | 1.13E−2 |

Exemplary Embodiments

Embodiment A1. A flexible display, comprising: a plurality of functional layers comprising a display layer having a display component, a plurality of bonding layers comprising a bonding component, each of the plurality of bonding layers is disposed between two adjacent functional layers, and a stiff layer having an elastic modulus greater than an elastic modulus of each of the plurality of functional layers to adjust a position of a neutral plane of the flexible display within the display layer.

Embodiment A2. The flexible display of Embodiment A1, wherein the stiff layer is disposed below a first layer of the plurality of functional layers, the first layer above the display layer.

Embodiment A3. The flexible display of Embodiment A1 or 2, wherein the stiff layer is disposed above a second layer of the plurality of functional layers, the second layer below the display layer.

Embodiment A4. The flexible display of any one of Embodiments A1-A3, wherein the stiff layer is disposed below a second layer of the plurality of functional layers, the second layer below the display layer.

Embodiment A5. The flexible display of any one of Embodiments A1-A4, wherein a thickness of the stiff layer is selected at least in part based on at least one of the plurality of functional layers' elastic modulus.

Embodiment A6. The flexible display of any one of Embodiments A1-A5, wherein a thickness of the stiff layer is selected at least in part based on at least one of the plurality of functional layers' thickness.

Embodiment A7. The flexible display of any one of Embodiments A1-A6, wherein a thickness of the stiff layer is selected at least in part based on at least one of the plurality of bonding layers' elastic modulus.

Embodiment A8. The flexible display of any one of Embodiments A1-A7, wherein a thickness of the stiff layer is selected at least in part based on at least one of the plurality of bonding layers' thickness.

Embodiment A9. The flexible display of any one of Embodiments A1-A8, wherein the display component comprises an organic light-emitting device.

Embodiment A10. The flexible display of any one of Embodiments A1-A9, wherein the bonding component comprises at least one of acrylate, urethane, silicone, and polyolefin.

Embodiment A11. The flexible display of any one of Embodiments A1-A10, wherein at least one of the bonding layers comprising an interlocking device comprising a first interlocking component and a second interlocking component engaging with the first interlocking component.

Embodiment A12. The flexible display of Embodiment A11, wherein the interlocking device has a height no more than 10 mm.

Embodiment A13. The flexible display of Embodiment A11 or A12, wherein the interlocking device further comprises an optical coupler between the first interlocking component and the second interlocking component.

Embodiment A14. The flexible display of Embodiment A13, wherein the optical coupler is liquid, adhesive, gel, or a combination thereof.

Embodiment A15. The flexible display of Embodiment A13, wherein the optical coupler has a refractive index having an absolute different less than or equal to 0.05 from a refractive index of the interlocking device.

Embodiment A16. The flexible display of any one of Embodiments A11-A15, wherein the interlocking device is optically clear.

Embodiment A17. The flexible display of any one of Embodiments A11-A16, wherein the first or the second interlocking component comprises a plurality of engagement elements.

Embodiment A18. The flexible display of Embodiment A17, wherein at least some of the engagement elements has a cross-sectional shape having a stem and a cap wider than the stem.

Embodiment A19. The flexible display of any one of Embodiments A11-A18, wherein the first or the second interlocking component comprises a plurality of engagement rails.

Embodiment A20. The flexible display of Embodiment A19, wherein at least some of the engagement rails has a cross-sectional shape having a stem and a cap.

Embodiment A21. The flexible display of Embodiment A19, wherein at least some of the engagement rails has one or more slits.

Embodiment A22. The flexible display of any one of Embodiments A11-A21, wherein the first fastener comprises a set of first engagement elements and the second fastener comprises a set of second engagement elements.

Embodiment A23. The flexible display of Embodiment A15, wherein the first engagement elements have generally same shapes as the second engagement elements.

Embodiment A24. The flexible display of any one of Embodiments A11-A23, wherein the flexible display has an X axis and a Y axis generally perpendicular to the X axis, wherein the flexible display is configured to bend about the Y axis.

Embodiment A25. The flexible display of Embodiment A24, wherein the interlocking device is disposed along the X axis.

Embodiment A26. The flexible display of Embodiment A24, wherein the interlocking device comprises a first interlocking segment and a second interlocking segment, wherein the first interlocking segment is disposed approximate to a first edge along X axis of the flexible display and the second interlocking segment is disposed approximate to a second edge along X axis of the flexible display.

Embodiment A27. The flexible display of Embodiment A24, wherein the interlocking device comprises a plurality of interlocking segments.

Embodiment A28. The flexible display of Embodiment A26, wherein the plurality of interlocking segments are disposed in a pattern.

Embodiment A29. The flexible display of Embodiment A26, wherein at least two of the plurality of interlocking segments are generally parallel to each other.

Embodiment A30. The flexible display of Embodiment A26, wherein the plurality of interlocking segments are disposed with generally equal spacing along X axis and Y axis.

Embodiment A31. The flexible display of any one of Embodiments A1-A30, wherein at least one of the functional layers comprises at least one of a touch sensitive device, an electrical circuit, a battery, and a protection film.

Embodiment A32. The flexible display of any one of Embodiments A1-A31, wherein at least one of the bonding layers comprises an optical clear material.

Embodiment A33. The flexible display of Embodiment A31, wherein the optical clear material includes an optical clear adhesive, optical clear gel, or optical clear liquid.

Embodiment A34. The flexible display of any one of Embodiments A11-33, wherein the interlocking device is disposed outside viewing area.

Embodiment A35. The flexible display of Embodiment A32, wherein at least part of the interlocking device is disposed within viewing area.

Embodiment A36. The flexible display of Embodiment A35, wherein the at least part of the interlocking device disposed within viewing area is optically clear.

Embodiment A37. The flexible display of Embodiment A36, wherein the optical clear material has a refractive index having an absolute different less than or equal to 0.05 from a refractive index of the interlocking device.

Embodiment B1. A flexible display, comprising: a plurality of functional layers comprising a display layer having a display component, a plurality of bonding layers comprising a bonding component, each of the plurality of bonding layers is disposed between two adjacent functional layers, wherein at least one of the plurality of functional layers is nonplanar in an unstrained state.

Embodiment B2. The flexible display of Embodiment B1, wherein the at least one of the plurality of functional layers has a first part and a second part forming an angle with the first part when the at least one of the plurality of functional layers is in the unstrained state.

Embodiment B3. The flexible display of Embodiment B2, wherein the angle is less than 150°.

Embodiment B4. The flexible display of Embodiment B1, wherein the at least one of the plurality of functional layers has a wavy shape when the at least one of the plurality of functional layers is in the unstrained state.

Embodiment B5. The flexible display of any one of Embodiments B1-B4, wherein the at least one of the plurality of functional layers comprises a nonplanar substrate in an unstrained state.

Embodiment B6. The flexible display of any one of Embodiments B1-B5, wherein the at least one of the plurality of functional layers is not a protective layer.

Embodiment C1. A flexible display, comprising: a first layer and a second layer, a bonding layer disposed between the first layer and the second layer, wherein the bonding layer comprises an interlocking device, wherein the interlocking device comprises a first interlocking component attached to or integrated with the first layer and a second interlocking component attached to or integrated with the second layer configured to engage with the first interlocking component such that the engagement prevent the separation of the first layer from the second layer along a direction generally perpendicular to a surface of the second layer.

Embodiment C2. The flexible display of Embodiment C1, wherein the interlocking device has a height no more than 10 mm.

Embodiment C3. The flexible display of Embodiment C1 or C2, wherein the interlocking device further comprises an optical coupler between the first interlocking component and the second interlocking component.

Embodiment C4. The flexible display of Embodiment C3, wherein the optical coupler is liquid, adhesive, gel, or a combination thereof.

Embodiment C5. The flexible display of Embodiment C4, wherein the optical coupler has a refractive index having an absolute different less than or equal to 0.05 from a refractive index of the interlocking device.

Embodiment C6. The flexible display of any one of Embodiments C1-05, wherein the interlocking device is optically clear.

Embodiment C7. The flexible display of any one of Embodiments C1-C6, wherein the first or the second interlocking component comprises a plurality of engagement elements.

Embodiment C8. The flexible display of Embodiment C7, wherein at least some of the engagement elements form a sliding channel.

Embodiment C9. The flexible display of Embodiment C7, wherein at least some of the engagement elements has a cross-sectional shape having a stem and a cap wider than the stem.

Embodiment C10. The flexible display of any one of Embodiments C1-C9, wherein the first or the second interlocking component comprises a plurality of engagement rails.

Embodiment C11.

The flexible display of Embodiment C10, wherein at least some of the engagement rails has a cross-sectional shape having a stem and a cap.

Embodiment C12. The flexible display of Embodiment C10, wherein at least some of the engagement rails has one or more slits.

Embodiment C13. The flexible display of any one of Embodiments C1-C12, wherein the first fastener comprises a set of first engagement elements and the second fastener comprises a set of second engagement elements.

Embodiment C14. The flexible display of Embodiment C13, wherein the first engagement elements have generally same shapes as the second engagement elements.

Embodiment C15. The flexible display of any one of Embodiments C1-C14, wherein the flexible display has a X axis and a Y axis generally perpendicular to the X axis, wherein the flexible display is configured to bend about the Y axis.

Embodiment C16. The flexible display of Embodiment C15, wherein the interlocking device is disposed along the X axis.

Embodiment C17. The flexible display of Embodiment C15, wherein the interlocking device comprises a first interlocking segment and a second interlocking segment, wherein the first interlocking segment is disposed approximate to a first edge along X axis of the flexible display and the second interlocking segment is disposed approximate to a second edge along X axis of the flexible display.

Embodiment C18. The flexible display of Embodiment C15, wherein the interlocking device comprises a plurality of interlocking segments.

Embodiment C19. The flexible display of Embodiment C18, wherein the plurality of interlocking segments are disposed in a pattern.

Embodiment C20. The flexible display of Embodiment C18, wherein at least two of the plurality of interlocking segments are generally parallel to each other.

Embodiment C21. The flexible display of Embodiment C18, wherein the plurality of interlocking segments are disposed with generally equal spacing along X axis and Y axis.

Embodiment C22. The flexible display of any one of Embodiments C1-C21, wherein at least one of the first layer and the second layer comprises at least one of a touch sensitive device, an electrical circuit, a battery, and a protection film.

Embodiment C23. The flexible display of any one of Embodiments C1-C22, wherein at least one of the first layer and the second layer comprises an organic light-emitting device.

Embodiment C24. The flexible display of any one of Embodiments C1-C23, wherein the bonding layer comprises an optical clear material.

Embodiment C25. The flexible display of Embodiment C24, wherein the optical clear material includes an optical clear adhesive, optical clear gel, optical clear elastomer, or optical clear liquid.

Embodiment C26. The flexible display of any one of Embodiments C1-C25, wherein the interlocking device is disposed outside viewing area.

Embodiment C27. The flexible display of Embodiment C24, wherein at least part of the interlocking device is disposed within viewing area.

Embodiment C28. The flexible display of Embodiment C27, wherein the at least part of the interlocking device disposed within viewing area is optically clear.

Embodiment C29. The flexible display of Embodiment C28, wherein the optical clear material in the bonding layer has a refractive index having an absolute different less than or equal to 0.05 from a refractive index of the interlocking device.

The present invention should not be considered limited to the particular examples and embodiments described above, as such embodiments are described in detail to facilitate explanation of various aspects of the invention. Rather the present invention should be understood to cover all aspects of the invention, including various modifications, equivalent processes, and alternative devices falling within the spirit and scope of the invention as defined by the appended claims and their equivalents.

What is claimed is:

1. A flexible display, comprising:
  a plurality of functional layers comprising a display layer having a display component,
    a plurality of bonding layers comprising a bonding component, each of the plurality of bonding layers is disposed between two adjacent functional layers, and
    a stiff layer having an elastic modulus greater than an elastic modulus of each of the plurality of functional layers to adjust a position of a neutral plane of the flexible display within the display layer,
    wherein at least one of the bonding layers comprising an interlocking device comprising a first interlocking component and a second interlocking component engaging with the first interlocking component,
    wherein the interlocking device further comprises an optical coupler between the first interlocking component and the second interlocking component,
    wherein the optical coupler has a refractive index having an absolute different less than or equal to 0.05 from a refractive index of the interlocking device.

2. The flexible display of claim 1, wherein the stiff layer is disposed below a first layer of the plurality of functional layers, and wherein the first layer is above the display layer.

3. The flexible display of claim 1, wherein the stiff layer is disposed above a second layer of the plurality of functional layers, and wherein the second layer is below the display layer.

4. The flexible display of claim 1, wherein a thickness of the stiff layer is selected at least in part based on at least one of the plurality of functional layers' elastic modulus.

5. The flexible display of claim 1, wherein a thickness of the stiff layer is selected at least in part based on at least one of the plurality of functional layers' thickness.

6. The flexible display of claim 1, wherein a thickness of the stiff layer is selected at least in part based on at least one of the plurality of bonding layers' elastic modulus.

7. The flexible display of claim 1, wherein a thickness of the stiff layer is selected at least in part based on at least one of the plurality of bonding layers' thickness.

8. The flexible display of claim 1, wherein the display component comprises an organic light-emitting device.

9. The flexible display of claim 1, wherein the interlocking device has a height no more than 10 mm.

10. A flexible display, comprising:
  a plurality of functional layers comprising a display layer having a display component,
  a plurality of bonding layers comprising a bonding component, each of the plurality of bonding layers is disposed between two adjacent functional layers,
  a stiff layer having an elastic modulus greater than an elastic modulus of each of the plurality of functional layers to adjust a position of a neutral plane of the flexible display within the display layer,
  wherein at least one of the bonding layers comprising an interlocking device comprising a first interlocking component and a second interlocking component engaging with the first interlocking component,
  wherein the first or the second interlocking component comprises a plurality of engagement elements.

11. The flexible display of claim 10, wherein the interlocking device is optically clear.

* * * * *